(12) United States Patent
Chen et al.

(10) Patent No.: US 9,154,076 B2
(45) Date of Patent: Oct. 6, 2015

(54) DUAL-MODE CRYSTAL OSCILLATOR

(71) Applicant: NIHON DEMPA KOGYO CO., LTD., Tokyo (JP)

(72) Inventors: Wen Jen Chen, Saitama (JP); Chisato Ishimaru, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 14/296,470

(22) Filed: Jun. 5, 2014

(65) Prior Publication Data

US 2014/0361842 A1 Dec. 11, 2014

(30) Foreign Application Priority Data

Jun. 5, 2013 (JP) ................................. 2013-118733

(51) Int. Cl.
| | | |
|---|---|---|
| G04F 5/06 | (2006.01) | |
| H01L 41/053 | (2006.01) | |
| H01L 41/083 | (2006.01) | |
| H01L 41/09 | (2006.01) | |
| H03B 5/32 | (2006.01) | |
| H03H 9/05 | (2006.01) | |
| H03H 9/19 | (2006.01) | |
| H03L 7/18 | (2006.01) | |
| H03B 5/36 | (2006.01) | |
| H03B 1/02 | (2006.01) | |

(52) U.S. Cl.
CPC *H03B 5/36* (2013.01); *G04F 5/063* (2013.01); *H01L 41/053* (2013.01); *H01L 41/083* (2013.01); *H01L 41/0913* (2013.01); *H03B 1/02* (2013.01); *H03B 5/32* (2013.01); *H03H 9/0547* (2013.01); *H03H 9/19* (2013.01); *H03L 7/18* (2013.01)

(58) Field of Classification Search
CPC ............. G04F 5/04; G04F 5/06; G04F 5/063; G06F 1/04–1/10; H01L 41/053; H01L 41/083; H01L 41/0913; H03B 5/30; H03B 5/32; H03H 9/05; H03H 9/0514; H03H 9/0538; H03H 9/0547; H03H 9/17; H03H 9/172; H03H 9/176; H03H 9/19; H03L 1/028; H03L 7/16; H03L 7/18
USPC ........ 310/311, 344, 348, 368; 331/49, 68, 69, 331/116 FE, 116 M, 116 R, 154, 156, 158, 331/179
See application file for complete search history.

(56) References Cited

U.S. PATENT DOCUMENTS 5,952,890 A * 9/1999 Fallisgaard et al. ............. 331/18
6,154,095 A * 11/2000 Shigemori et al. ............. 331/16
(Continued)

FOREIGN PATENT DOCUMENTS

JP 2012-100150 5/2012

*Primary Examiner* — Levi Gannon
(74) *Attorney, Agent, or Firm* — Jianq Chyun IP Office

(57) ABSTRACT

A dual-mode crystal oscillator includes a single AT-cut quartz crystal piece, a package, and an integrated circuit. The integrated circuit includes an oscillation circuit configured to cause the AT-cut quartz crystal piece to oscillate at a frequency in the MHz band, a dividing circuit configured to divide the frequency in the MHz band to generate a frequency of 32.768 kHz, a selection circuit configured to select one of a pause state where the frequency in the MHz band is not output and an active state where the frequency in the MHz band is output. The mounting surface includes three electrodes arranged in a direction along the long side and two electrodes arranged in a direction along the short side. The electrode to output the frequency of 32.768 kHz and the electrode to output the frequency in the MHz band are arranged not adjacent to one another.

4 Claims, 6 Drawing Sheets

(56) References Cited

U.S. PATENT DOCUMENTS

| | | | |
|---|---|---|---|
| 7,216,249 B2* | 5/2007 | Fujiwara et al. | 713/501 |
| 7,295,077 B2* | 11/2007 | Thomsen et al. | 331/10 |
| 7,378,780 B2* | 5/2008 | Mizumura et al. | 310/341 |
| 2004/0135645 A1* | 7/2004 | Koyama et al. | 331/158 |
| 2007/0120614 A1* | 5/2007 | Moriya et al. | 331/158 |
| 2008/0068102 A1* | 3/2008 | Moriya et al. | 331/68 |
| 2009/0021315 A1* | 1/2009 | Harima | 331/68 |
| 2010/0314971 A1* | 12/2010 | Kaida et al. | 310/344 |
| 2014/0306582 A1* | 10/2014 | Matsuzawa et al. | 310/366 |

* cited by examiner

DUAL-MODE CRYSTAL OSCILLATOR

CROSS-REFERENCE TO RELATED APPLICATIONS

This application claims the priority benefit of Japan application serial no. 2013-118733, filed on Jun. 5, 2013. The entirety of the above-mentioned patent application is hereby incorporated by reference herein and made a part of this specification.

TECHNICAL FIELD

This disclosure relates to a dual-mode crystal oscillator including an AT-cut quartz-crystal vibrating piece.

DESCRIPTION OF THE RELATED ART

A tuning-fork type crystal resonator has been used for a crystal resonator for a clock and outputs a signal of 32.768 kHz. The tuning-folk type crystal resonator, however, is large in size and has a problem that its vibrating frequency is susceptible to a temperature change.

In some circumstances, a signal with another frequency in addition to a signal of 32.768 kHz is desired to be output. In such a case, another crystal resonator with capacitors was required to form another circuit. Specifically, two capacitors were required for each crystal resonator. Thus, two crystal resonators and four capacitors, which amount to six elements in total, were required.

To solve the problem associated with a tuning-fork type crystal resonator similar to the one described above, and to cut down the number of required elements, Japanese Unexamined Patent Application Publication No. 2012-100150 (hereinafter referred to as Patent Literature 1) discloses a dual-mode crystal oscillator that outputs two frequencies with one crystal resonator alone. Patent Literature 1 discloses a method for generating a 32.768 kHz clock frequency from two frequencies in a dual-mode crystal oscillator.

Outputting a total of three frequencies including one for a clock signal complicates electric wiring and increases power consumption.

A need thus exists for a dual-mode crystal oscillator which is not susceptible to the drawback mentioned above.

SUMMARY

A dual-mode crystal oscillator according to a first aspect of the disclosure includes a single AT-cut quartz crystal piece, a package, and an integrated circuit. The single AT-cut quartz crystal piece is configured to vibrate at an MHz band. The package houses the AT-cut quartz crystal piece and includes a mounting surface to be mounted. The mounting surface has a rectangular shape with a long side and a short side. The integrated circuit is housed in the package. The integrated circuit includes an oscillation circuit configured to cause the AT-cut quartz crystal piece to oscillate at a frequency in the MHz band, a dividing circuit configured to divide the frequency in the MHz band to generate a frequency of 32.768 kHz, a selection circuit configured to select one of a pause state where the frequency in the MHz band is not output and an active state where the frequency in the MHz band is output in a state where the frequency of 32.768 kHz is output. The mounting surface includes three electrodes arranged in a direction along the long side and two electrodes arranged in a direction along the short side. The electrode to output the frequency of 32.768 kHz and the electrode to output the frequency in the MHz band are arranged not adjacent to one another in the long side direction nor in the short side direction.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

The embodiments of this disclosure will be described with reference to the attached drawings. It will be understood that the scope of the disclosure is not limited to the described embodiments, unless otherwise stated.

Configuration of Dual-Mode Crystal Oscillator 100 According to First Embodiment

Figure 1:
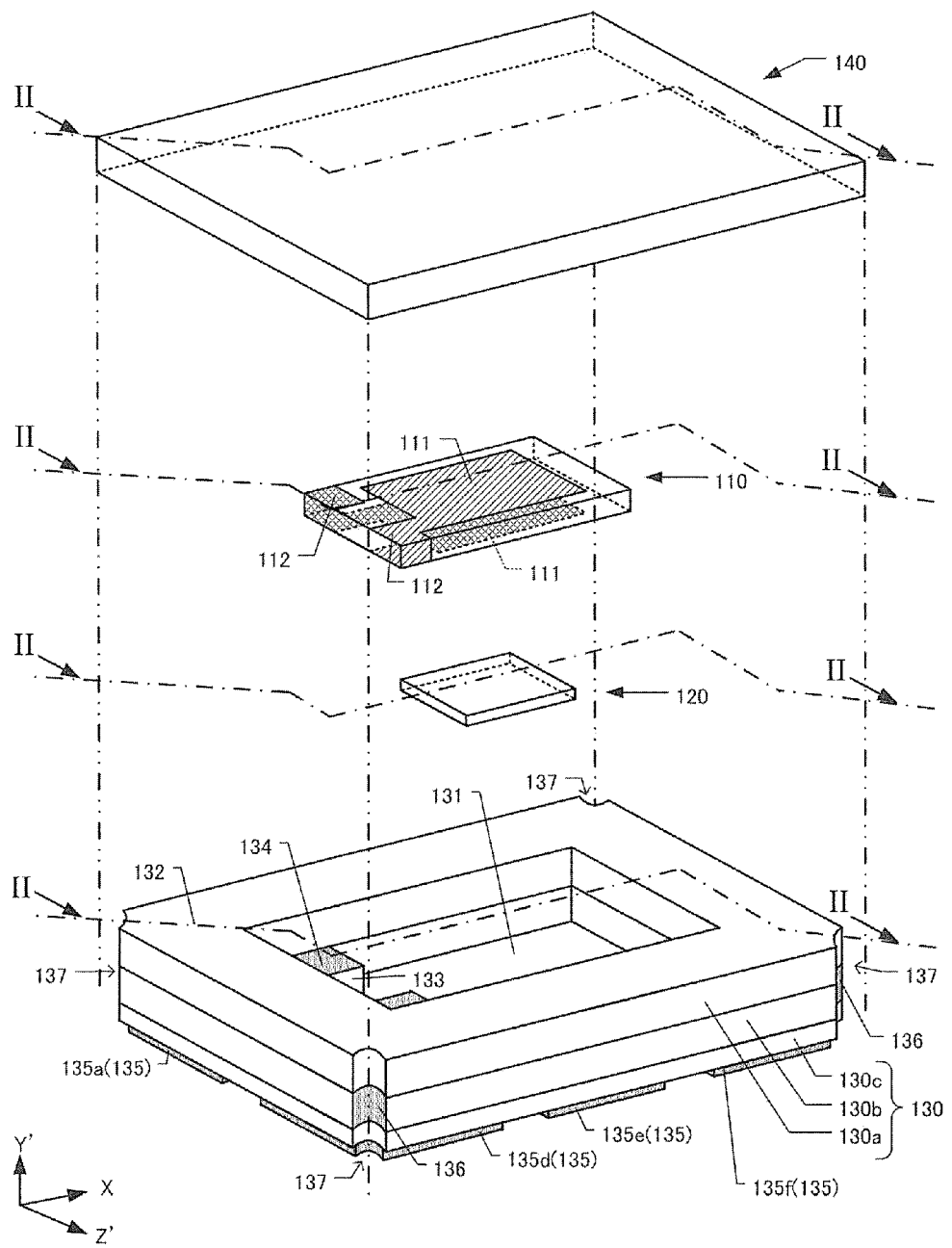
FIG. 1 is an exploded perspective view illustrating a dual-mode crystal oscillator 100.

FIG. 1 is an exploded perspective view illustrating a dual-mode crystal oscillator 100. The dual-mode crystal oscillator 100 is a surface mount type crystal controlled oscillator. The dual-mode crystal oscillator 100 is used by being attached to, for example, a printed circuit board. The dual-mode crystal oscillator 100 is mainly formed with a quartz-crystal vibrating piece 110, an integrated circuit (IC) 120, a package 130, and a lid plate 140. The quartz-crystal vibrating piece 110 employs an AT-cut quartz-quartz-crystal vibrating piece. The AT-cut quartz-quartz-crystal vibrating piece has a principal surface (Y-Z plane) that is tilted by 35° 15' about the Y-axis of crystallographic axes (XYZ) in the direction from the Z-axis to the Y-axis around the X-axis. In the following description, new axes tilted with respect to the axis direction of the AT-cut quartz-crystal vibrating piece are denoted as Y'-axis and Z'-axis. That is, the dual-mode crystal oscillator 100 will be explained by assuming the longitudinal direction of the dual-mode crystal oscillator 100 as the X-axis direction, the height direction of the dual-mode crystal oscillator 100 as the Y'-axis direction, and a direction vertical to the X- and Y'-axis directions as the Z'-axis direction.

The quartz-crystal vibrating piece 110 includes excitation electrodes 111. The excitation electrodes 111 are formed on the +Y'-axis side surface and the −Y'-axis side surface. From each excitation electrode 111, an extraction electrode 112 is extracted to the side at the −X-axis side of the quartz-crystal vibrating piece 110. The extraction electrode 112 extracted from the excitation electrode 111 on the +Y'-axis side surface is extended to the +Z'-axis side at the −X-axis side, and then to the −Y'-axis side surface via a side surface at the +Z'-axis side. The extraction electrode 112 extracted from the excitation electrode 111 on the −Y'-axis side surface is extended to the −Z'-axis side at the −X-axis side, and then to the +Y'-axis side surface via a side surface at the −Z'-axis side.

The IC 120 is electrically connected to the quartz-crystal vibrating piece 110 to form an electric circuit. On the −Y'-axis side surface of the IC 120, a plurality of terminals are formed. These terminals are electrically connected to the extraction electrodes 112 of the quartz-crystal vibrating piece 110 or to external electrodes 135 formed on the package 130.

The package 130 is formed with its long sides in the X-axis direction and short sides in the Z'-axis direction. The external electrodes 135 are formed on the surface at the −Y'-axis side of the package 130 to be a mounting surface on which the dual-mode crystal oscillator 100 is to be mounted. On the +Y'-axis side surface, a bonding surface 132 and a depressed portion 131 are formed. The bonding surface 132 is to be bonded to the lid plate 140. The depressed portion 131 is depressed in the −Y'-axis direction from the bonding surface 132. Furthermore, in the depressed portion 131, placing portions 133 are formed. The quartz-crystal vibrating piece 110 is to be placed on the placing portions 133. On the +Y'-axis side surface of the placing portion 133, a connecting electrode 134 is formed. The connecting electrode 134 is electrically connected to the extraction electrode 112 of the quartz-crystal vibrating piece 110 via conductive adhesive 152 (see FIG. 2). The package 130, for example, employs ceramics as a base material. The package 130 is formed by laminating three layers of a first layer 130a, a second layer 130b, and a third layer 130c. The first layer 130a is disposed at the +Y'-axis side of the package 130. On the +Y'-axis side surface of the first layer 130a, the bonding surface 132 is formed. The second layer 130b is disposed by being bonded to the −Y'-axis side surface of the first layer 130a, thus forming the placing portion 133. The third layer 130c is formed on the −Y'-axis side surface of the second layer 130b. On the −Y'-axis side surface of the third layer 130c, external electrodes 135 are formed. At four corners at the side surfaces of the package 130, castellations 137 are formed. The castellations 137 are depressed toward the inside of the package 130. On the second layer 130b at the castellations 137, frequency-checking electrodes 136 are formed. These frequency-checking electrodes 136 are formed to check the frequency of the quartz-crystal vibrating piece 110 after the dual-mode crystal oscillator 100 is completed.

The lid plate 140 is formed in a flat plate shape. The lid plate 140 is bonded to the bonding surface 132 of the package 130 via a sealing material 151 (see FIG. 2), thus sealing the depressed portion 131 of the package 130.

Figure 2:
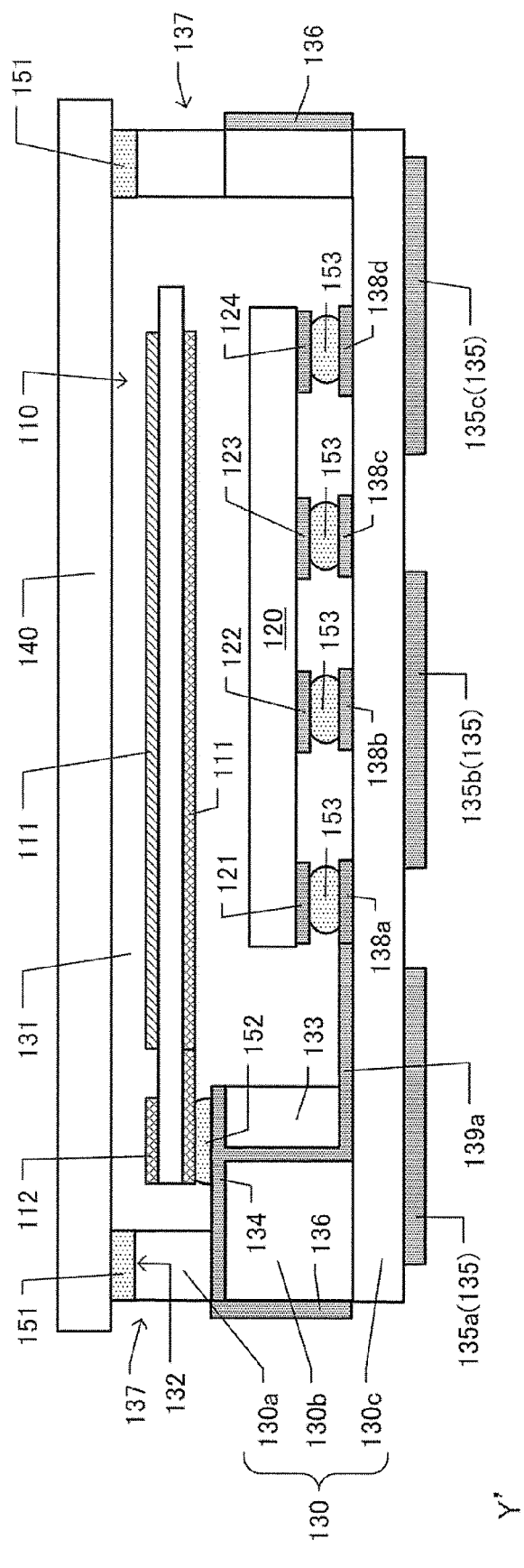
FIG. 2 is a cross-sectional view taken along the line II-II of FIG. 1.

FIG. 2 is a cross-sectional view taken along the line II-II of FIG. 1. In the depressed portion 131, which is sealed with the lid plate 140, the quartz-crystal vibrating piece 110 and the IC 120 are placed. The quartz-crystal vibrating piece 110 is placed on the placing portions 133, which are formed on the second layer 130b of the package 130, via the conductive adhesive 152. The IC 120 is placed on the +Y'-axis side surface of the third layer 130c via bumps 153. From the +Y'-axis side surface of the third layer 130c to the +Y'-axis side surface of the placing portions 133, wiring electrodes 139a are formed. Accordingly, the extraction electrodes 112 of the quartz-crystal vibrating piece 110 are electrically connected to a crystal terminal 121 of the IC 120 via the conductive adhesive 152, the connecting electrodes 134, the wiring electrodes 139a, and the bumps 153. The connecting electrodes 134 are electrically connected to the frequency-checking electrodes 136 formed at the castellations 137 at the −X-axis side.

Figure 3A:
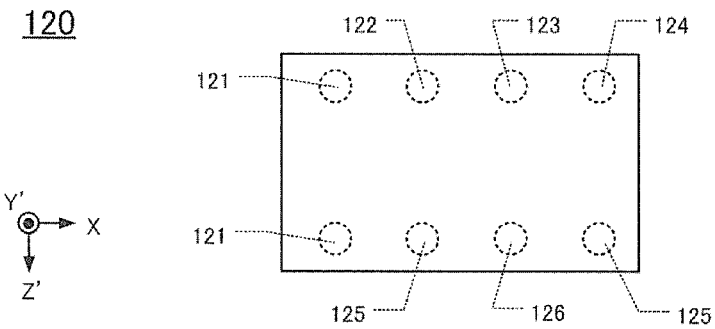
FIG. 3A is a plan view illustrating an IC 120.

FIG. 3A is a plan view of the IC 120. On the −Y'-axis side surface of the IC 120, eight terminals are formed. As those terminals, four terminals are arranged in the X-axis direction and two terminals are arranged in the Z'-axis direction. FIG. 3A illustrates eight terminals formed on the −Y'-axis side of the IC 120 with circles in dotted lines. In FIG. 3A, at the ends at the +Z'-axis side and the −Z'-axis side on the −X-axis side of the IC 120, crystal terminals 121 are formed. The crystal terminals 121 are electrically connected to the extraction electrodes 112 of the quartz-crystal vibrating piece 110. Adjacently at the +X-axis side of the crystal terminal 121 at the −Z'-axis side, a power source terminal 122 is formed. The power source terminal 122 is to be connected to the power source. Adjacently at the +X-axis side of the power source terminal 122, a switching terminal 123 is formed. This switching terminal 123 switches between an active state and a pause state. The active state allows outputting a MHz band frequency while the pause state allows not outputting MHz band frequency. As the terminal at +X-axis side of the switching terminal 123, a MHz band output terminal 124 is formed. The MHz band output terminal 124 outputs a MHz band frequency. Adjacently at the +X-axis side of the crystal terminal 121 at the +Z'-side, a grounding terminal 125 is formed. The grounding terminal 125 is to be grounded. Adjacently at the +X-axis side of the grounding terminal 125, a 32.768 kHz output terminal 126 is formed. The 32.768 kHz output terminal 126 outputs a 32.768 kHz frequency. Adjacently at the +X-axis side of the 32.768 kHz output terminal 126, a grounding terminal 125 is formed.

Figure 3B:
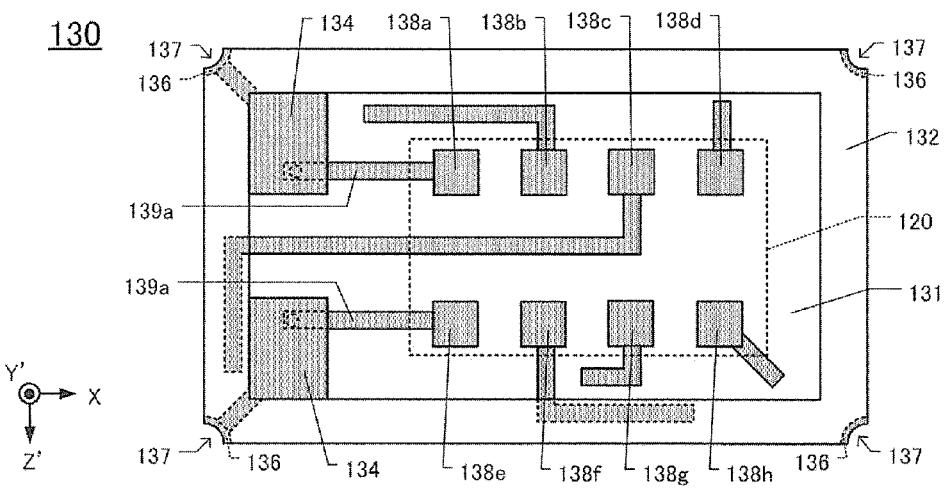
FIG. 3B is a plan view illustrating a package 130.

FIG. 3B is a plan view of the package 130. FIG. 3B mainly illustrates electrodes formed at the depressed portion 131. At the +Y'-axis side surface of the third layer 130c in the depressed portion 131, eight electrodes corresponding to the eight terminals of the IC 120 are formed. As these eight electrodes, four electrodes are arranged in the X-axis direction and two electrodes are arranged in the Z'-axis direction. From the −Z'-axis side end at the −X-axis side to the +X-axis direction, the electrodes are referred to as an electrode 138a, electrode 138b, electrode 138c, and electrode 138d. From the +Z'-axis side end at the −X-axis side to the +X-axis direction, the electrodes are referred to as an electrode 138e, electrode 138f, electrode 138g, and electrode 138h. The electrodes 138a and 138e are electrically connected to the connecting electrodes 134 via the wiring electrodes 139a. The electrode 138b, electrode 138c, electrode 138d, electrode 138f, electrode 138g, and electrode 138h are respectively electrically connected to the power source terminal 122, the switching terminal 123, the MHz band output terminal 124, the grounding terminal 125, the 32.768 kHz output terminal 126, and a grounding terminal 125 of the IC 120.

On the other hand, on the package 130, the frequency-checking electrodes 136 are formed at the portions corresponding to the castellations 137 at the second layer 130b. The frequency-checking electrodes 136 disposed at the −X-axis side of the package 130 are electrically connected to the connecting electrodes 134. The frequency-checking electrodes 136 disposed at the −X-axis side are used to directly measure and check the frequency of the AT-cut quartz-crystal vibrating piece 110 without using the IC 120 after the dual-mode crystal oscillator 100 is formed.

Figure 3C:
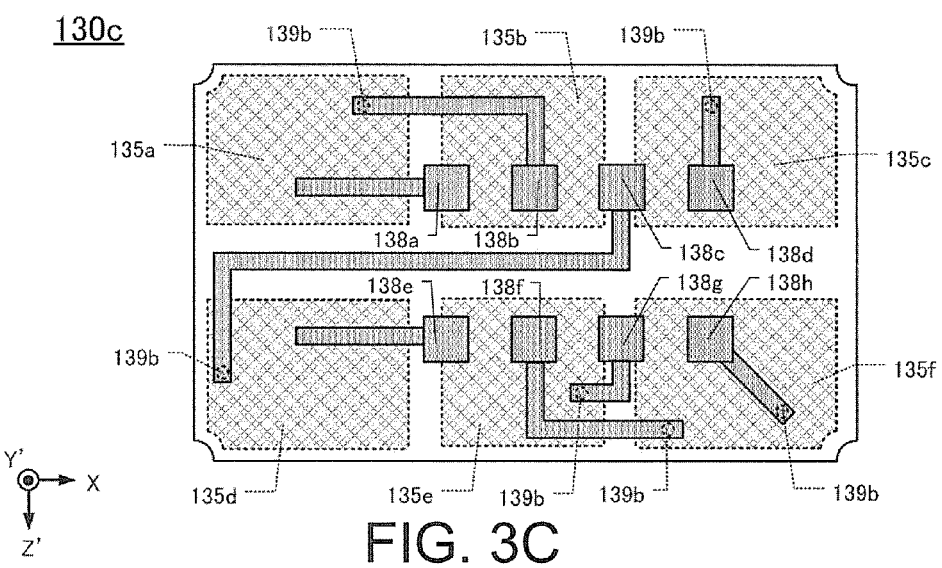
FIG. 3C is a plan view illustrating a third layer 130c of the package 130.

FIG. 3C is a plan view of the third layer 130c of the package 130. FIG. 3C illustrates the electrode 138a to the electrode 138h formed on the +Y'-axis side surface of the third layer 130c and transparently illustrates the external electrodes 135, which are formed on the mounting surface (−Y'-axis side surface) of the third layer 130c. As the external electrodes 135, three electrodes are arranged on the −Y'-axis side surface in the X-axis direction and two electrodes are arranged in the Z'-axis direction of the third layer 130c. In FIG. 3C, the external electrode 135 at the −X-axis side and the −Z'-axis side is referred to as an external electrode 135a, and from the external electrode 135a to the +X-direction, the external electrode 135 are referred to as an external electrode 135b and an external electrode 135c. Also, the external electrode 135 at the −X-axis side and the +Z'-axis side is referred to as an external electrode 135d, and from the external electrode 135d to the +X-axis direction, the external electrode 135 are referred to as external electrode 135e and an external electrode 135f.

The electrode 138b extends to a position where the electrode 138b overlaps the external electrode 135a in the Y'-axis direction. The electrode 138b is then electrically connected to the external electrode 135a via a through electrode 139b, which passes through the third layer 130c. When the dual-mode crystal oscillator 100 is mounted, the external electrode 135a is connected to a positive supply voltage (Vcc). The electrode 138c extends to a position where the electrode 138c overlaps the external electrode 135d in the Y'-axis direction. The electrode 138c is electrically connected to the external electrode 135d via the through electrode 139b, which passes through the third layer 130c. By applying a control voltage to the external electrode 135d, whether or not to output a MHz band frequency is selected, that is, the active state or the pause state is selected. The electrode 138d extends to position where the electrode 138d overlaps the external electrode 135c in the Y'-axis direction. The electrode 138d is electrically connected to the external electrode 135c via the through electrode 139b, which passes through the third layer 130c. The external electrode 135c is an electrode that outputs a MHz band frequency. The electrode 138f and the electrode 138h extend to positions where the electrode 138f and the electrode 138h overlap the external electrode 135f in the Y'-axis direction. The electrode 138f and the electrode 138h are electrically connected to the external electrode 135f via the through electrodes 139b, which pass through the third layer 130c. The external electrode 135f is an electrode to be grounded. The electrode 138g extends to a position where the electrode 138g overlaps the external electrode 135e in the Y'-axis direction. The electrode 138g is electrically connected to the external electrode 135e via the through electrode 139b, which passes through the third layer 130c. The external electrode 135e is an electrode that outputs a 32.768 kHz frequency. The external electrode 135b is a no connection (NC) electrode that is not connected to any electrode in the dual-mode crystal oscillator 100. The external electrode 135b, similarly to the external electrode 135f, may be used as an electrode to be grounded.

As illustrated by FIG. 3C, the dual-mode crystal oscillator 100 has the external electrode 135a, the external electrode 135c, the external electrode 135d, and the external electrode 135f at the four corners. The external electrode 135a is connected to a positive supply voltage (Vcc) at the corner at the −X-axis side and the −Z'-axis side. The external electrode 135c is formed at the corner at the +X-axis side and the −Z'-axis side. The external electrode 135c outputs a MHz band frequency. The external electrode 135d is formed at the corner at the −X-axis side and the +Z-axis side. A control voltage to select the active state or the pause state is applied to the external electrode 135d. The external electrode 135f is formed at corner at the +X-axis side and the +Z'-axis side. The external electrode 135f is an electrode to be grounded. This arrangement of the external electrodes is the same as the arrangement of the external electrodes used in a conventional general-purpose crystal controlled oscillator. Thus, a user of the dual-mode crystal oscillator 100 can use the wiring of the printed circuit board or a similar component where the dual-mode crystal oscillator 100 is to be placed without a significant change from the wiring for the conventional general-purpose crystal controlled oscillator. Therefore, this is preferable. At the dual-mode crystal oscillator 100, in order to form external electrodes at respective positions illustrated in FIG. 3C, a part of the wiring that extends from the electrode 138c to the external electrode 135d is formed underneath the IC 120 (see FIGS. 3B and 3C).

Figure 4:
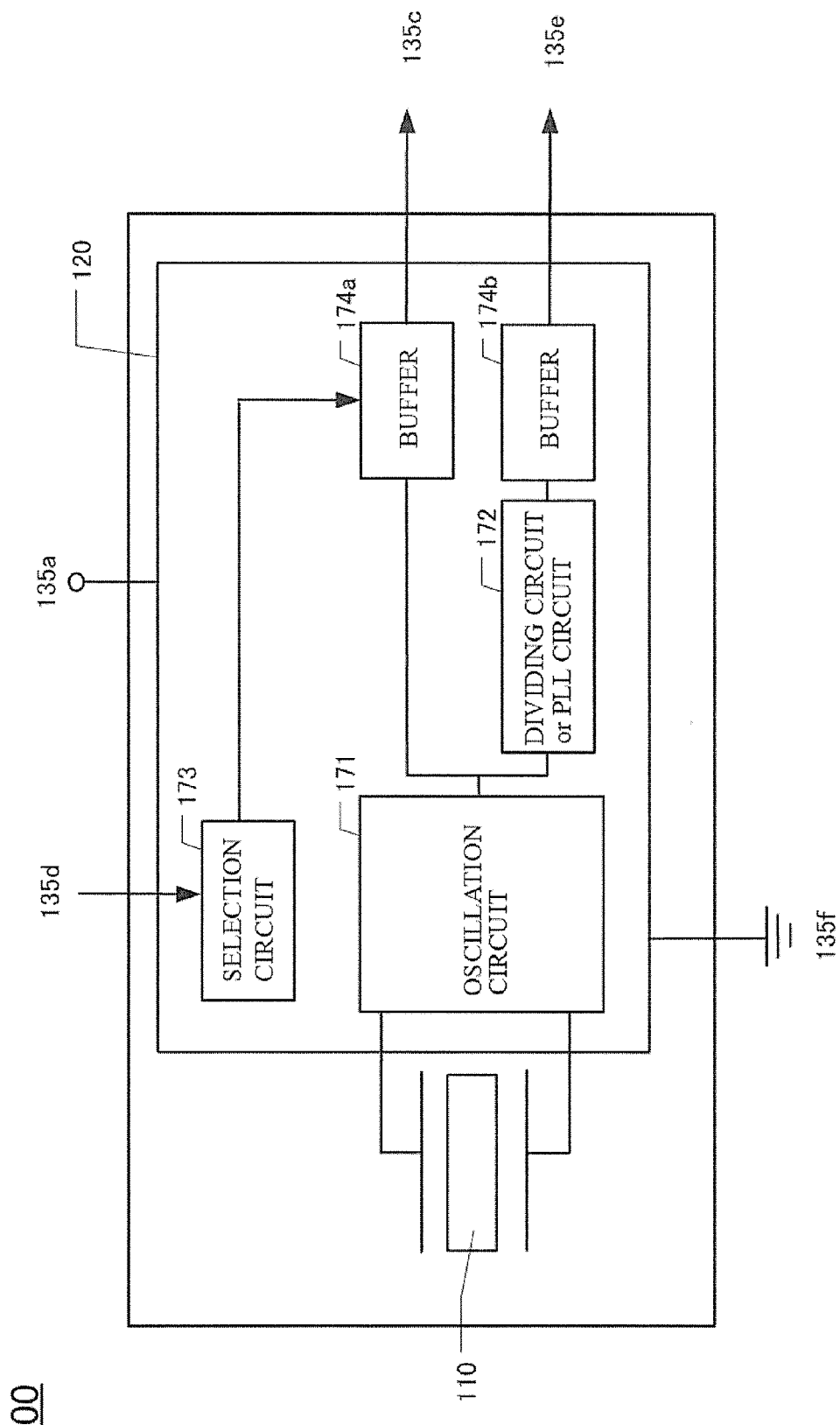
FIG. 4 is a circuit diagram illustrating the dual-mode crystal oscillator 100.

FIG. 4 is a circuit diagram illustrating the dual-mode crystal oscillator 100. The circuit of the dual-mode crystal oscillator 100 is mainly formed with the AT-cut quartz-crystal vibrating piece 110 and the IC 120. The AT-cut quartz-crystal vibrating piece 110 is connected to an oscillation circuit 171 of the IC 120 to generate a MHz band frequency. Since a frequency at the AT-cut quartz-crystal vibrating piece 110 is inversely proportional to the thickness of the AT-cut quartz-crystal vibrating piece 110, the frequency is adjusted mainly by, for example, adjusting the thickness of the AT-cut quartz-crystal vibrating piece 110. A frequency signal generated in the oscillation circuit 171 is output from the external electrode 135c via a buffer 174a.

On the other hand, a MHz band frequency signal generated in the oscillation circuit 171 is divided in a dividing circuit 172 into 32.768 kHz frequency signals. The 32.768 kHz frequency signal is output from the external electrode 135e via a buffer 174b. Thus, the dual-mode crystal oscillator 100 can output a MHz band frequency signal and a 32.768 kHz frequency signal. In the description above, the dividing circuit 172 is used for the IC 120. However, the dividing circuit 172 may be replaced with a phase locked loop (PLL) circuit.

Furthermore, when not using the MHz band frequency signal with the dual-mode crystal oscillator 100, it is possible to stop the output of the MHz band frequency signal. In the IC 120, a selection circuit 173 is connected to the buffer 174a. The buffer 174a outputs a MHz band frequency signal. The selection circuit 173 controls the output of the MHz band frequency. The selection circuit 173 limits the frequency signal output from the buffer 174a by receiving a control voltage from the external electrode 135d. The IC 120 is electrically connected to each of the external electrode 135a and the external electrode 135f.

As described above, the dual-mode crystal oscillator 100 can output signals of only two frequencies, a 32.768 kHz frequency and a MHz band frequency. When not using the MHz band frequency, the MHz band frequency can be controlled so as not to be output. This allows reducing electric consumption in the dual-mode crystal oscillator 100 compared with electric consumption in a conventional one.

Furthermore, an AT-cut quartz-crystal vibrating piece has a smaller frequency variation with respect to temperature changes compared with a tuning-fork type quartz-crystal vibrating piece, thus having a more excellent frequency versus temperature characteristic compared with that of the tuning-fork type quartz-crystal vibrating piece. That is, in the dual-mode crystal oscillator 100, the use of the AT-cut quartz-crystal vibrating piece provides a more excellent frequency versus temperature characteristic than that in the case of the use of the tuning-fork type quartz-crystal vibrating piece.

Furthermore, in the dual-mode crystal oscillator 100, the external electrode 135c, which outputs the MHz band frequency, the external electrode 135e, which outputs the 32.768 kHz frequency, and the external electrode 135a, which is connected to the power source, are formed so as not to be adjacent to one another in the X-axis direction and the Z'-axis direction. These external electrodes are arranged to be separated the most from one another (see FIG. 3C). Thus, the 32.768 kHz frequency signal and the MHz band frequency signal are not likely to interfere with each other and are not likely to be affected by the interference from the power source voltage. Thus, the dual-mode crystal oscillator 100 can output more precise signals.

Second Embodiment

In a dual-mode crystal oscillator, an AT-cut quartz-crystal vibrating piece and an IC may be divided from each other. The following describes a dual-mode crystal oscillator 200 where an AT-cut quartz-crystal vibrating piece and an IC are divided from each other. Like reference numerals designate corresponding or identical elements throughout the first embodiment, and therefore such elements will not be further elaborated here.

Configuration of Dual-Mode Crystal Oscillator 200

Figure 5:
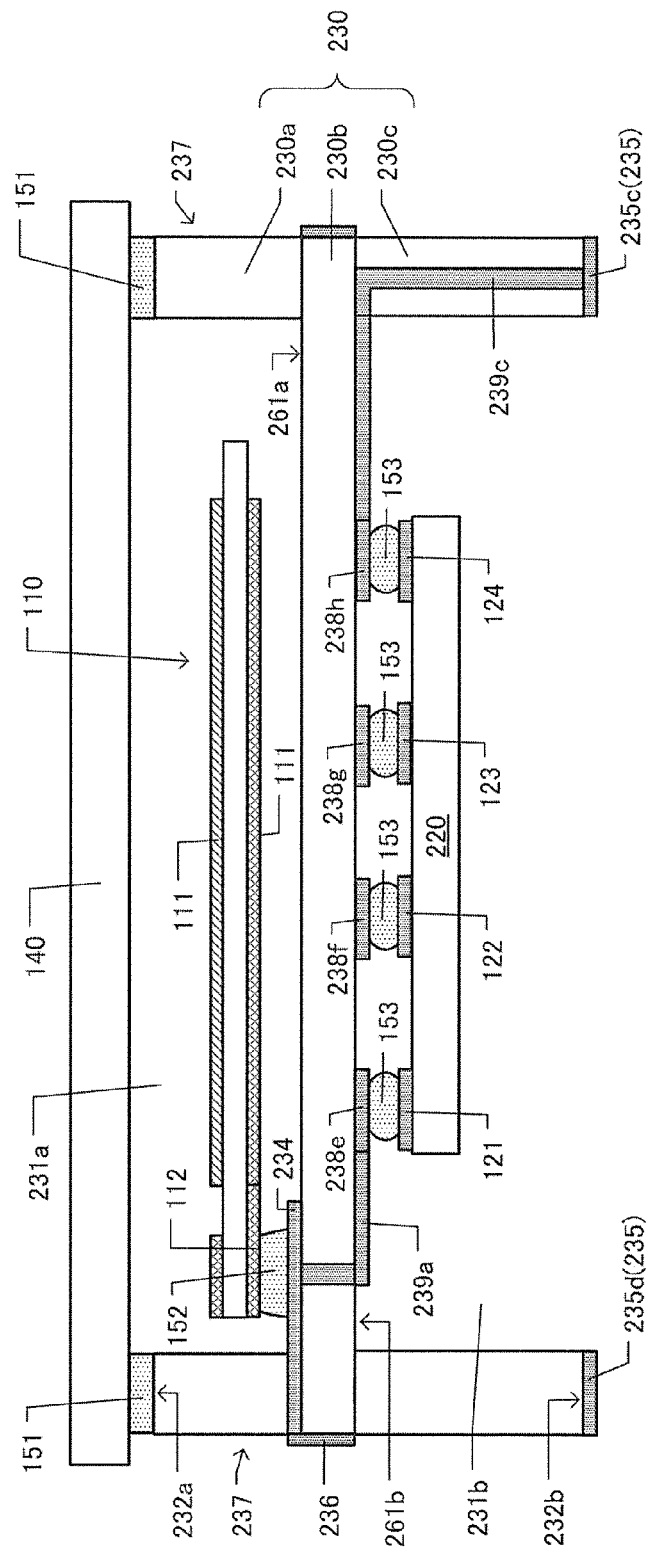
FIG. 5 is a cross-sectional view illustrating a dual-mode crystal oscillator 200.

FIG. 5 is a cross-sectional view of the dual-mode crystal oscillator 200. FIG. 5 is a cross-sectional view including the cross section taken along the line V-V of FIG. 6B, which will be described later. The dual-mode crystal oscillator 200 mainly includes the quartz-crystal vibrating piece 110, an IC 220, a package 230, and the lid plate 140.

The package 230 is formed with its long sides in the X-axis direction and its short sides in the Z'-axis direction. On the +Y'-axis side surface of the package 230, a bonding surface 232a and a depressed portion 231a are formed. The bonding surface 232a is to be bonded to the lid plate 140. The depressed portion 231a is depressed in the −Y'-axis direction from the bonding surface 232a. The −Y'-axis side surface of the package 230 forms a mounting surface 232b on which the dual-mode crystal oscillator 200 is to be mounted. On the −Y'-axis side surface of the package 230, a depressed portion 231b is formed. The depressed portion 231b is depressed from the mounting surface 232b in the +Y'-axis direction. The depressed portion 231a is sealed by bonding the lid plate 140 to the bonding surface 232a via the sealing material 151. On the mounting surface 232b, the external electrodes 235 are formed. The external electrodes 235 include the external electrode 235a to the external electrode 235f (see FIG. 6B).

The −Y'-axis side surface inside of the depressed portion 231a of the package 230 forms a bottom surface 261a. On this bottom surface 261a, the quartz-crystal vibrating piece 110 is placed. On the bottom surface 261a, a connecting electrode 234 is formed. The extraction electrode 112 of the quartz-crystal vibrating piece 110 is electrically connected to this connecting electrode 234 via the conductive adhesive 152. The +Y'-axis side surface inside of the depressed portion 231b of the package 230 forms a ceiling surface 261b. On this ceiling surface 261b, the IC 220 is placed. On the ceiling surface 261b, electrodes 238a to 238h are formed. Terminals 121 to 126 (see FIG. 6A) formed on the IC 220 are electrically connected to these electrodes 238a to 238h via the bumps 153.

The package 230 uses ceramics as its base material. The package 230 is formed by laminating three layers of a first layer 230a, a second layer 230b, and a third layer 230c. The first layer 230a is disposed at the +Y'-axis side of the package 230. On the +Y'-axis side surface of the first layer 230a, the bonding surface 232a is formed. The first layer 230a is a layer that forms side surfaces of the depressed portion 231a. The second layer 230b is disposed by being bonded to the −Y'-axis side surface of the first layer 230a. In this layer, the +Y'-axis side surface of the second layer 230b is the bottom surface 261a. The −Y'-axis side surface of the second layer 230b is the ceiling surface 261b. The second layer 230b is disposed between the depressed portion 231a and the depressed portion 231b to divide the depressed portion 231a and the depressed portion 231b from each other. The third layer 230c is formed on the −Y'-axis side surface of the second layer 230b. On the −Y'-axis side surface of the third layer 230c, the external electrodes 235 are formed. The third layer 230c is a layer that forms a side surface of the depressed portion 231b. At four corners at the side surfaces of the package 230, castellations 237 are formed. The castellations 237 are depressed toward the inside of the package 230. On the second layer 230b at the castellations 237, frequency-checking electrodes 236 are formed. These frequency-checking electrodes 236 are used to check the frequency of the quartz-crystal vibrating piece 110 after the dual-mode crystal oscillator 200 is completed. The frequency-checking electrode 236 is electrically connected to the extraction electrode 112 of the quartz-crystal vibrating piece 110 via the connecting electrode 234. In the package 230, castellations may be formed not only on the side surfaces at the four corners, but also on side surfaces including the long sides and the short sides of the package 230. In this case, frequency-checking electrodes may be formed on the castellations formed in the side surfaces including the long sides and the short sides.

Figure 6A:
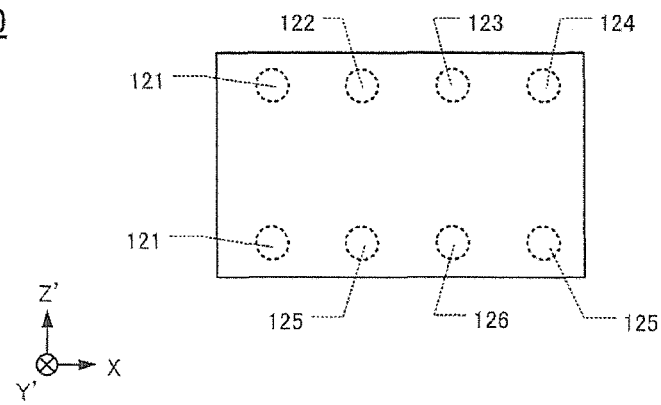
FIG. 6A is a plan view illustrating an IC 220.

FIG. 6A is a plan view of the IC 220. FIG. 6A illustrates the IC 220 viewed from the −Y'-axis side. On the +Y'-axis side surface of the IC 220, eight terminals are formed. As the eight terminals, four terminals are arranged in the X-axis direction and two terminals are arranged in the Z'-axis direction. FIG. 6A illustrates eight terminals formed on the +Y'-axis side of the IC 220 with circles in dotted lines. In FIG. 6A, the crystal terminals 121 are formed at the ends at the +Z'-axis side and the −Z'-axis side on the −X-axis side of the IC 220. In FIG. 6A, the power source terminal 122 is formed adjacently at the +X-axis side of the crystal terminal 121 at the +Z'-axis side. In FIG. 6A, the switching terminal 123 is formed adjacently at the +X-axis side of the power source terminal 122. In FIG. 6A, the MHz band output terminal 124 is formed adjacently at the +X-axis side of the switching terminal 123. Adjacently at the +X-axis side of the crystal terminal 121 at the −Z'-side, the grounding terminal 125 is formed. Adjacently at the +X-axis side of the grounding terminal 125, the 32.768 kHz output terminal 126 is formed. Adjacently at the +X-axis side of the 32.768 kHz output terminal 126, the grounding terminal 125 is formed.

Figure 6B:
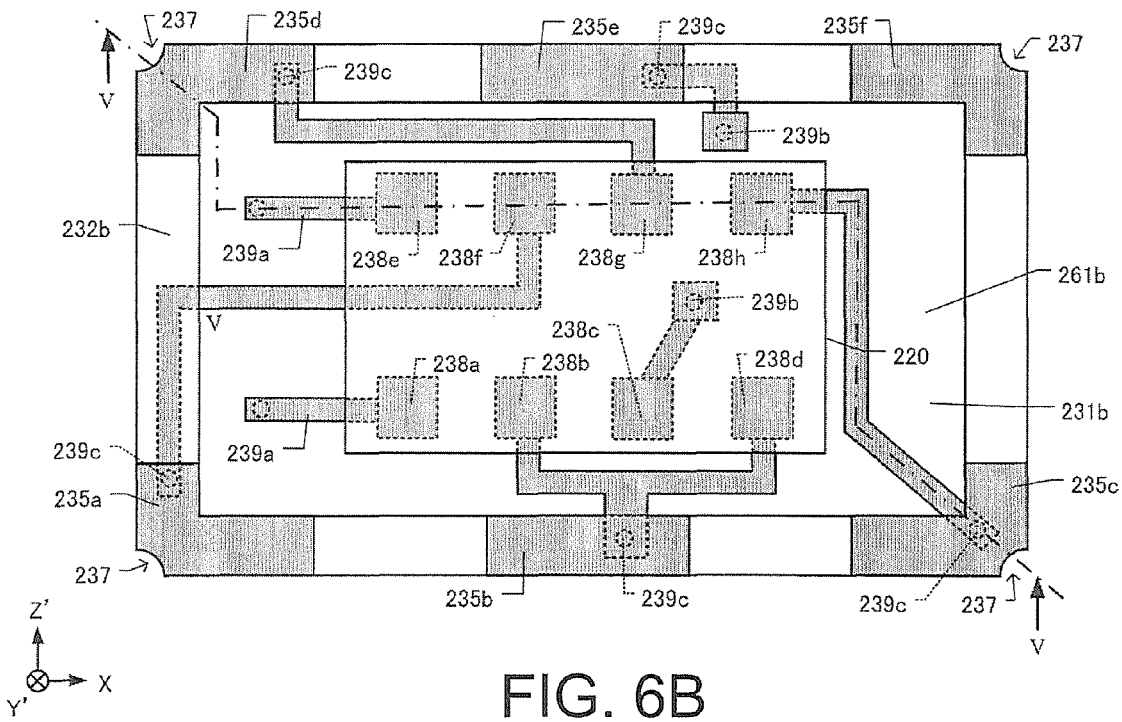
FIG. 6B is a view of the dual-mode crystal oscillator 200 viewed from the −Y'-axis side.

FIG. 6B illustrates the dual-mode crystal oscillator 200 viewed from the −Y'-axis side. In the dual-mode crystal oscillator 200, the mounting surface 232b is formed so as to surround the depressed portion 231b. On the mounting surface 232b, external electrodes 235a to 235f are formed. At the −X-axis side and the −Z'-axis side of the mounting surface 232b, the external electrode 235a is formed. From the external electrode 235a to the +X-axis direction, an external electrode 235b and an external electrode 235c are formed. At the −X-axis side and the +Z'-axis side of the mounting surface 232b, an external electrode 235d is formed. From the external electrode 235d to the +X direction, an external electrode 235e and an external electrode 235f are formed. The external electrode 235a is connected to a positive supply voltage (Vcc). The external electrode 235b is an electrode to be grounded. The external electrode 235c is an electrode that outputs a MHz band frequency. The external electrode 235d is an electrode for selecting the active state or the pause state by applying a control voltage. The external electrode 235e is an electrode that outputs a 32.768 kHz frequency. The external electrode 235f is an electrode to be grounded.

FIG. 6B illustrates the electrode 238a to the electrode 238h formed on the ceiling surface 261b of the dual-mode crystal oscillator 200, transparently through the IC 220. The electrodes 238a and 238e are connected to the crystal terminal 121 of the IC 220 via the bumps 153. The electrodes 238a and 238e are also electrically connected to the connecting electrode 234 formed on the bottom surface 261a (see FIG. 5) via a wiring electrode 239a. The electrode 238b and the electrode 238d are connected to the grounding terminal 125 of the IC 220 and the external electrode 235b. The electrode 238f is connected to the power source terminal 122 and the external electrode 235a of the IC 220. The electrode 238g is connected to the switching terminal 123 and the external electrode 235d of the IC 220. The electrode 238h is connected to the MHz band output terminal 124 and the external electrode 235c of the IC 220. Furthermore, the electrode 238c is connected to the 32.768 kHz output terminal 126 while being connected to the external electrode 235e via a through electrode 239b. The second layer 230b is formed by laminating two layers. The through electrode 239b positioned close to the electrode 238c is electrically connected to the through electrode 239b positioned close to the external electrode 235e, through the area between the two layers forming the second layer 230b. The electrode 238b, the electrode 238d, the electrode 238f, the electrode 238g, and the electrode 238h are electrically connected to the respective external electrodes 235 via the through electrodes 239c, which passes through the third layer 230c.

Representative embodiments are described in detail above; however, as will be evident to those skilled in the relevant art, this disclosure may be changed or modified in various ways within its technical scope.

For example, in the embodiments above, an external electrode that outputs a 32.768 kHz frequency and an external electrode that outputs a MHz band frequency may be arranged interchangeably.

In the dual-mode crystal oscillator according to the first aspect, the dual-mode crystal oscillator according to a second aspect may be configured as below. The package includes a castellation at each of four corners of outside surface of the package, the castellation being depressed toward an inside of the package. The package includes a pair of placing portions at one of the short sides inside the package. The AT-cut quartz crystal piece is placed on the pair of placing portions. The electrode to output the frequency in the MHz band is arranged at another of the short sides, the electrode to output the frequency of 32.768 kHz being arranged at a middle of the three electrodes arranged in the direction along the long side.

In the dual-mode crystal oscillator according to the first aspect, the dual-mode crystal oscillator according to the second aspect may further include a pair of frequency-checking electrodes each disposed at the castellation closest to each of the pair of the placing portions. The frequency-checking electrodes are for checking the frequency of the AT-cut quartz crystal piece.

In the dual-mode crystal oscillator according to the second aspect or the third aspect, the dual-mode crystal oscillator according to the fourth aspect may further include an electrode to be grounded, an electrode to be connected to a power source, and an electrode to select the pause or the active state. The electrode to be grounded is disposed adjacent to the electrode to output the frequency in the MHz band along the short side direction. The electrode to be connected to a power source is disposed at one corner of the short side. The electrode to select the pause state or the active state is disposed adjacent to the electrode to be connected to a power source along the short side direction.

The dual-mode crystal oscillator according to this disclosure is able to output two frequencies including one for a clock signal (32.768 kHz).

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A dual-mode crystal oscillator, comprising:
a single AT-cut quartz crystal piece configured to vibrate at an MHz band;
a package that houses the AT-cut quartz crystal piece and includes a mounting surface to be mounted, the mounting surface having a rectangular shape with a long side and a short side; and
an integrated circuit housed in the package, the integrated circuit including an oscillation circuit configured to cause the AT-cut quartz crystal piece to oscillate at a frequency in the MHz band, a dividing circuit configured to divide the frequency in the MHz band to generate a frequency of 32.768 kHz, a selection circuit configured to select a pause state where the frequency in the MHz band is not output but the frequency of 32.768 kHz is output or an active state where the frequency in the MHz band is output and the frequency of 32.768 kHz is output, wherein
the mounting surface includes three electrodes arranged in a direction along the long side and two electrodes arranged in a direction along the short side, and
the electrode to output the frequency of 32.768 kHz and the electrode to output the frequency in the MHz band are arranged not adjacent to one another in the long side direction nor in the short side direction.

2. The dual-mode crystal oscillator according to claim 1, wherein
the package includes a castellation at each of four corners of outside surface of the package, the castellation being depressed toward an inside of the package,
the package includes a pair of placing portions at one of the short sides inside the package, the AT-cut quartz crystal piece being placed on the pair of placing portions, and
the electrode to output the frequency in the MHz band is arranged at another of the short sides, the electrode to output the frequency of 32.768 kHz being arranged at a middle of the three electrodes arranged in the direction along the long side.

3. The dual-mode crystal oscillator according to claim 2, further comprising:
a pair of frequency-checking electrodes each disposed at the castellation closest to each of the pair of the placing portions, the pair of frequency-checking electrodes being for checking the frequency of the AT-cut quartz crystal piece.

4. The dual-mode crystal oscillator according to claim 2, further comprising:
an electrode to be grounded, the electrode to be grounded being disposed adjacent to the electrode to output the frequency in the MHz band along the short side direction;
an electrode to be connected to a power source, the electrode to be connected to a power source being disposed at one corner of the short side; and
an electrode to select the pause state or the active state, the electrode to select the pause state or the active state being disposed adjacent to the electrode to be connected to a power source along the short side direction.

* * * * *